(12) United States Patent
Wei et al.

(10) Patent No.: US 10,476,499 B2
(45) Date of Patent: Nov. 12, 2019

(54) LOW POWER CONSUMPTION POWER-ON RESET CIRCUIT AND REFERENCE SIGNAL CIRCUIT

(71) Applicant: RICHTEK TECHNOLOGY CORPORATION, Zhubei, Hsinchu (TW)

(72) Inventors: Chin-Yuan Wei, Miaoli (TW); Chih-Hsien Wang, Hsinchu (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 0 days.

(21) Appl. No.: 15/951,772

(22) Filed: Apr. 12, 2018

(65) Prior Publication Data

US 2019/0097623 A1    Mar. 28, 2019

(30) Foreign Application Priority Data

Sep. 25, 2017   (TW) .............................. 106132811 A

(51) Int. Cl.
| | |
|---|---|
| H03L 7/00 | (2006.01) |
| H03K 17/22 | (2006.01) |
| G06F 1/24 | (2006.01) |
| H03F 3/16 | (2006.01) |
| H03K 3/356 | (2006.01) |
| H03F 3/45 | (2006.01) |

(52) U.S. Cl.
CPC ............. *H03K 17/223* (2013.01); *G06F 1/24* (2013.01); *H03F 3/16* (2013.01); *H03F 3/45183* (2013.01); *H03K 3/356008* (2013.01); *H03F 2200/186* (2013.01); *H03F 2203/45498* (2013.01); *H03F 2203/45674* (2013.01)

(58) Field of Classification Search
CPC ......... H03L 7/0891; H03L 7/18; H03L 7/093; H03L 7/087; H03L 7/10
USPC ................................ 327/143, 539, 205–206
See application file for complete search history.

(56) References Cited

U.S. PATENT DOCUMENTS

| | | | | |
|---|---|---|---|---|
| 5,814,995 | A * | 9/1998 | Tasdighi .......... | G01R 19/16542 324/431 |
| 7,109,697 | B1 * | 9/2006 | Atrash ................ | H03F 3/45183 323/280 |
| 7,812,649 | B2 * | 10/2010 | Barnett ................ | H03K 17/223 327/143 |
| 9,882,558 | B1 * | 1/2018 | Sun ....................... | H03K 17/223 |

* cited by examiner

*Primary Examiner* — Anh Q Tra
(74) *Attorney, Agent, or Firm* — Tung & Associates

(57) ABSTRACT

A power-on reset (POR) circuit includes: a signal generator circuit for generating a first and a second signal according to an input voltage, and a comparator circuit. The comparator circuit, having a non-zero input offset, includes a first MOS transistor with a first conductive type and having a first conductive type gate and a first threshold voltage, and a second MOS transistor with a first conductive type and having a second conductive type gate and a second threshold voltage. The input offset relates to a difference between the first and the second threshold voltage. The first and the second signal control the first and the second MOS transistors respectively to generate a POR signal. When the input voltage exceeds a POR threshold which relates to a predetermined multiple or ratio of the input offset, the POR signal transits its state.

19 Claims, 8 Drawing Sheets

LOW POWER CONSUMPTION POWER-ON RESET CIRCUIT AND REFERENCE SIGNAL CIRCUIT

CROSS REFERENCE

The present invention claims priority to TW 106132811, filed on Sep. 25, 2017.

BACKGROUND OF THE INVENTION

Field of Invention

The present invention relates to a power-on reset (POR) circuit and a reference signal circuit. Particularly, it relates to a POR circuit and a reference signal circuit having a low temperature coefficient and low power consumption.

Description of Related Art

Bandgap circuits composed of bipolar transistors are commonly used for obtaining a POR threshold or a reference voltage with a low temperature coefficient.

However, such prior art POR circuits or reference voltage generators using bandgap circuits composed of bipolar transistors are more complex, consume higher operating current, and cost higher.

Compared to the aforementioned prior art, the present invention is advantageous in simplified circuit, lower cost and lower operating current.

SUMMARY OF THE INVENTION

From one perspective, the present invention provides a power-on reset (POR) circuit, configured to operably generate a power-on reset signal, comprising: a signal generator circuit, configured to operably generate a first signal and a second signal; and a comparator circuit, including a first input terminal and a second input terminal which are electrically connected to the first signal and the second signal respectively, wherein the comparator circuit compares the first signal and the second signal to generate a comparator output signal, wherein the POR circuit generates the POR signal according to the comparator output signal, the comparator circuit including: a first MOS transistor of a first conductive type, coupled to the first input terminal, wherein the first MOS transistor includes a first conductive type gate and a first threshold voltage; and a second MOS transistor of the first conductive type, coupled to the second input terminal, wherein the second MOS transistor includes a second conductive type gate and a second threshold voltage; wherein each of the first MOS transistor and the second MOS transistor is biased in a subthreshold region; wherein the first signal and the second signal control the first MOS transistor and the second MOS transistor respectively to generate the comparator output signal; wherein a differential input level of the comparator circuit includes a non-zero input offset, wherein the input offset relates to a difference between the first threshold voltage and the second threshold voltage; wherein when the input voltage rises to exceed a first POR threshold, the comparator output signal transits from a first state to a second state; wherein the first POR threshold substantially is a product of the input offset multiplied by a predetermined number.

In one embodiment, the first MOS transistor has a first aspect ratio and the second MOS transistor has a second aspect ratio, wherein the first MOS transistor is biased with a first bias current, and the second MOS transistor is biased with a second bias current, wherein at least one of the following parameters is determined such that a temperature coefficient of the first POR threshold is substantially zero: (1) the first aspect ratio, (2) the second aspect ratio, (3) the first bias current, (4) the second bias current, and/or (5) a product of or a ratio among the above parameters of (1) to (4).

In one embodiment, the POR circuit further includes a signal adjusting circuit configured to operably adjust the comparator output signal to generate the POR signal.

In one embodiment, the first MOS transistor and the second MOS transistor form an input differential pair.

In one embodiment, the input differential pair is a common source differential pair, a source of the first MOS transistor and a source of the second MOS transistor being connected to a common source node to form the common source differential pair, a gate of the first MOS transistor being coupled to the first input terminal and a gate of the second MOS transistor being coupled to the second input terminal, and the comparator circuit generates the comparator output signal according to a difference between a first drain current of the first MOS transistor and a second drain current of the second MOS transistor.

In one embodiment, the comparator circuit further includes a current mirror circuit, coupled with the first MOS transistor and the second MOS transistor, and is configured to operably mirror and compare the first drain current and the second drain current to generate the comparator output signal.

In one embodiment, the temperature coefficient is substantially zero by determining a mirror ratio of the current mirror circuit.

In one embodiment, the comparator circuit further includes a bias circuit which includes a bias current source or a bias resistor coupled to the common source node, the bias circuit being configured to provide the first bias current and the second bias current.

In one embodiment, the first signal and the second signal are different divided voltages of the input voltage.

In one embodiment, the signal generator circuit includes a hysteresis control switch, configured to adjust a ratio of the first signal and the second signal according to a signal relating to the POR signal (a POR related signal), such that when the input voltage falls lower than a second POR threshold, the POR signal transits from the second state to the first state, wherein the second POR threshold is lower than the first POR threshold such that the POR signal includes a hysteresis correlated to the input voltage.

In one embodiment, both the first MOS transistor and the second MOS transistor are of the same one of the following types of MOS transistors: (1) enhancement mode MOS transistor, (2) depletion mode MOS transistor, or (3) native transistor.

In one embodiment, the first POR threshold is determined by the POR circuit according to a ratio between the first signal and the second signal.

From another perspective, the present invention provides a reference signal circuit, configured to operably generate a reference signal, comprising: a signal generator circuit, including: an active device, configured to operably convert an input voltage to the reference signal according to an amplifier output signal; a voltage divider circuit, coupled to the reference signal, wherein the voltage divider circuit generates a first signal and a second signal according to the reference signal, wherein the first signal and the second signal are different divided voltages of the reference signal;

and an amplifier circuit, including a first input terminal and a second input terminal which are electrically connected to the first signal and the second signal respectively, wherein the amplifier circuit amplifies a difference between the first signal and the second signal to generate the amplifier output signal, the amplifier circuit including: a first MOS transistor of a first conductive type, coupled to the first input terminal, wherein the first MOS transistor includes a first conductive type gate and a first threshold voltage; and a second MOS transistor of the first conductive type, coupled to the second input terminal, wherein the second MOS transistor includes a second conductive type gate and a second threshold voltage; wherein the first signal and the second signal control the first MOS transistor and the second MOS transistor respectively to generate the amplifier output signal; wherein each of the first MOS transistor and the second MOS transistor is biased in a subthreshold region; wherein a differential input level of the amplifier circuit includes a non-zero input offset, wherein the input offset relates to a difference between the first threshold voltage and the second threshold voltage; wherein the amplifier circuit controls the active device to regulate the reference signal substantially to a product of the input offset multiplied by a predetermined number, wherein the predetermined number relates to a ratio of the first signal and the second signal.

In one embodiment, the first MOS transistor has a first aspect ratio and the second MOS transistor has a second aspect ratio, wherein the first MOS transistor is biased with a first bias current, and the second MOS transistor is biased with a second bias current, wherein at least one of the following parameters is determined such that a temperature coefficient of the reference signal is substantially zero: (1) the first aspect ratio, (2) the second aspect ratio, (3) the first bias current, (4) the second bias current, and/or (5) a product of or a ratio among the above parameters of (1) to (4).

In one embodiment, the first MOS transistor and the second MOS transistor form an input differential pair.

In one embodiment, a source of the first MOS transistor and a source of the second MOS transistor are connected to a common source node to form a common source differential pair, and a gate of the first MOS transistor is coupled to the first input terminal and a gate of the second MOS transistor is coupled to the second input terminal, wherein the amplifier circuit generates the amplifier output signal according to a difference between a first drain current of the first MOS transistor and a second drain current of the second MOS transistor.

In one embodiment, the amplifier circuit further includes a current mirror circuit, coupled with the first MOS transistor and the second MOS transistor, and is configured to operably mirror the first drain current and the second drain current to generate the amplifier output signal.

In one embodiment, the temperature coefficient is substantially zero by determining a mirror ratio of the current mirror circuit.

In one embodiment, the amplifier circuit further includes a bias circuit which includes a bias current source or a bias resistor coupled to the common source node, the bias circuit being configured to provide the first bias current and the second bias current.

In one embodiment, both the first MOS transistor and the second MOS transistor are of the same one of the following types of MOS transistors: (1) enhancement mode MOS transistor, (2) depletion mode MOS transistor, or (3) native transistor.

In one embodiment, the reference signal is determined by the reference signal circuit according to a ratio between the first signal and the second signal.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the circuits and the signal waveforms, but not drawn according to actual scale.

Figure 1:
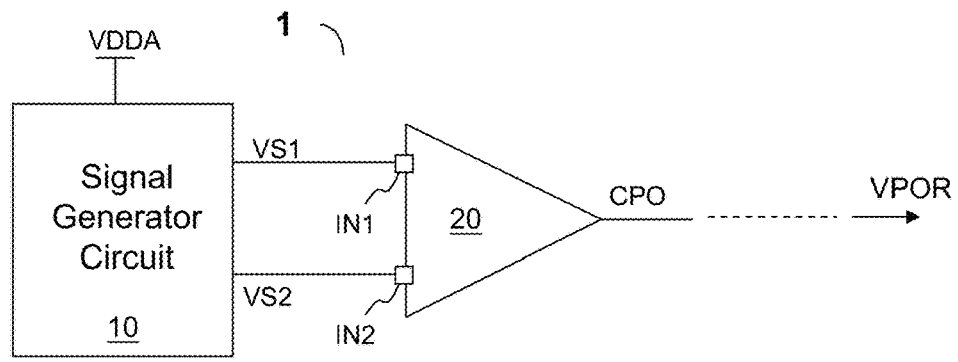
FIG. 1 shows a block diagram of an embodiment of the low power consumption POR circuit according to the present invention.

FIG. 1 shows one embodiment of the POR circuit according to the present invention (POR circuit 1). The POR circuit 1 generates a power-on reset (POR) signal VPOR according to an input voltage VDDA. The POR circuit 1 comprises a signal generator circuit 10 and a comparator circuit 20. The signal generator circuit 10 generates a first signal VS1 and a second signal VS2 according to the input voltage VDDA. The comparator circuit 20 includes a first input terminal IN1 and a second input terminal IN2 which are electrically connected to the first signal VS1 and the second signal VS2 respectively, wherein the comparator circuit 20 compares the first signal VS1 and the second signal VS2 to generate a comparator output signal CPO. The POR circuit 1 generates the POR signal VPOR according to the comparator output signal CPO, wherein the POR signal VPOR may be for example in-phase or out-of-phase with the comparator output signal CPO, which will be described in detail with embodiments later. In one embodiment, the comparator output signal CPO may be directly used as the POR signal VPOR, and in another embodiment, the comparator output signal CPO may be adjusted to become the POR signal VPOR.

Figure 2A:
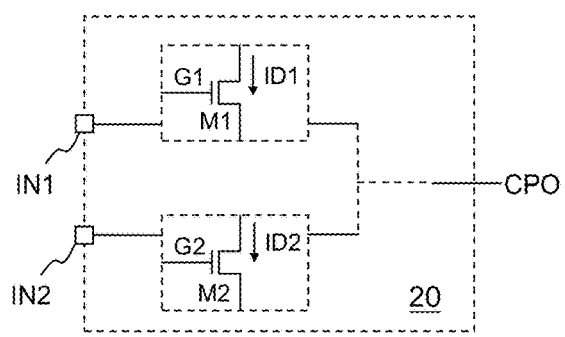
FIGS. 2A and 2B show schematic diagrams of embodiments of the comparator circuit of the low power consumption POR circuit according to the present invention.

FIG. 2A shows one embodiment of the comparator circuit of the POR circuit according to the present invention (comparator circuit 20). The comparator circuit 20 includes a first MOS transistor M1 of a first conductive type and a second MOS transistor M2 of the first conductive type. The first MOS transistor M1 is coupled to the first input terminal IN1 and includes a first conductive type gate G1 and a first threshold voltage VTH1. The second MOS transistor M2 is coupled to the second input terminal IN2 and includes a second conductive type gate G2 and a second threshold voltage VTH2. In this embodiment, each of the first MOS transistor M1 and the second MOS transistor M2 is biased in a subthreshold region. The first signal VS1 and the second signal VS2 control the first MOS transistor M1 and the second MOS transistor M2 respectively to generate the comparator output signal CPO. A differential input level (to be explained later) of the comparator circuit 20 includes a non-zero input offset VOS, wherein the input offset VOS relates to a difference between the first threshold voltage VTH1 and the second threshold voltage VTH2, for example (VTH2−VTH1). When the input voltage VDDA rises to exceed a first POR threshold VPR1, the comparator output signal CPO transits from a first state to a second state (for example CPO transits from a "low" or "0" state to a "high" or "1" state). In one embodiment, the POR signal VPOR also transits its state, for example in-phase or out-of-phase with the comparator output signal CPO, when the input voltage VDDA rises to exceed the first POR threshold VPR1. The first POR threshold VPR1 substantially is a product of the input offset VOS multiplied by a predetermined number. In one embodiment, the first MOS transistor M1 and the second MOS transistor M2 are or include one of the following types of MOS transistors: (1) enhancement mode MOS transistor, (2) depletion mode MOS transistor, or (3) native transistor. In one embodiment, the first MOS transistor M1 and the second MOS transistor M2 are of the same type (the same one of the aforementioned types of MOS transistors).

The aforementioned "predetermined" number may be a fixed value, or an adjustable variable; the same for the term "predetermined" used throughout the text. Also note that although it is intended for the first POR threshold VPR1 to be a product of the input offset VOS multiplied by a predetermined number, however, due to non-idealities caused by for example imperfection of components or imperfect matching among components, the first POR threshold VPR1 may not be exactly equal to the product of the input offset VOS multiplied by the predetermined number, but just close to the product of the input offset VOS multiplied by the predetermined number, and therefore the meaning of the term "substantially" should allow certain tolerable error. That is, the first POR threshold VPR1 is desired to be a product of the input offset VOS multiplied by a predetermined number; however in a real case, a certain level of error is tolerable according to the present invention. Other "substantially" used throughout the text also means that a tolerable error is allowed.

The "first conductive type" and the "second conductive type" indicate impurities of different conductive types doped into regions such as the source, drain and gate. The first conductive type is for example N type and the second conductive type is for example P type, or the opposite. Besides, the aforementioned first or the second conductive type gate means that the gate of the MOS transistor has a net concentration of the first or the second conductive type, while there may be dopants of different conductive types concurrently existing in the gate.

The "subthreshold region" indicates the operation region wherein the gate-source voltage of the MOS transistor is larger than 0 but smaller than the threshold voltage thereof (for example, the gate-source voltage of the first MOS transistor is in the range 0<VGS1<VTH1, and the gate-source voltage of the second MOS transistor is in the range 0<VGS2<VTH2, taking NMOS as an example). The "differential input level" means that there is an internal offset between the two input terminals of the comparator circuit. For example, when the first and the second input terminal IN1 and IN2 of the comparator circuit 20 receive the first signal VS1 and the second signal VS2 respectively, and the first signal VS1 and the second signal VS2 are at the same level, due to the "differential input level", the comparator circuit 20 will see that there is a difference between the first signal VS1 and the second signal VS2, and the difference is equal to the "differential input level". According to the present invention, the "differential input level" includes a non-zero "input offset VOS" because transistors with gates of different conductive types are coupled to the first and the second input terminals. Therefore, for example, the difference between the first input signal and the second input signal has to be larger than the "input offset VOS" in order for the comparator output signal CPO to transit its state.

Figure 2B:
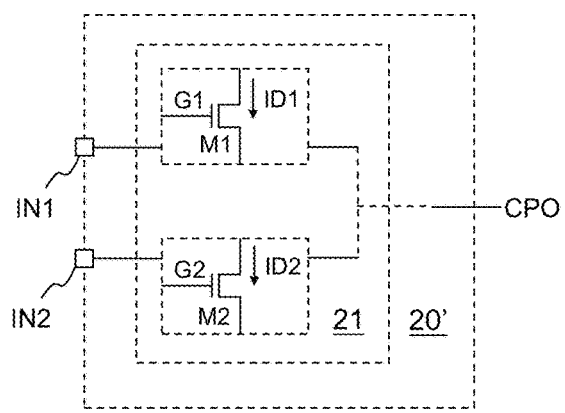

FIG. 2B shows a schematic diagram of an embodiment of the comparator circuit of the low power consumption POR circuit according to the present invention (comparator circuit 20'). The comparator circuit 20' is similar to the comparator circuit 20 shown in FIG. 2A. The first MOS transistor M1 and the second MOS transistor M2 of the comparator circuit 20' form an input differential pair 21, wherein the input differential pair 21 may be for example but not limited to a common source or a common gate differential pair.

In one embodiment, the first MOS transistor M1 has a first aspect ratio W1/L1 and the second MOS transistor M2 has a second aspect ratio W2/L2, wherein the first MOS transistor M1 is biased with a first bias current IDB1, and the second MOS transistor M2 is biased with a second bias current IDB2, wherein at least one of the following parameters is determined to make a temperature coefficient of the first POR threshold to be substantially zero: (1) the first aspect ratio W1/L1, (2) the second aspect ratio W2/L2, (3) the first bias current IDB1, (4) the second bias current IDB2, and/or (5) a product of or a ratio among the above parameters of (1) to (4). The aspect ratio W/L of a MOS transistor indicates, from a perspective of the layout of the MOS transistor, a ratio of a width W to a length L of a current channel of the MOS transistor ("current channel" is, taking an NMOS transistor for example, for a current to flow from the drain to the source). The "bias currents" IDB1 and IDB2 of the first and the second MOS transistors M1 and M2 indicate the drain currents of the first and the second MOS transistors which are operating in the subthreshold region while the comparator circuit is about to transits its state.

Figure 3A:
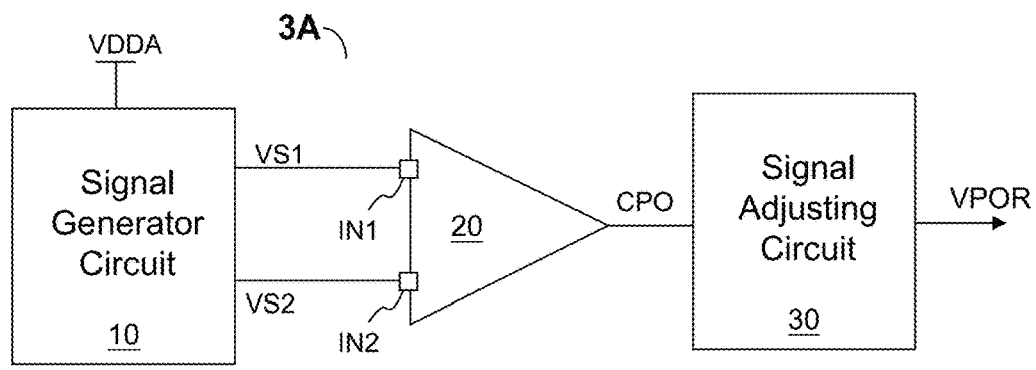
FIG. 3A shows a block diagram of an embodiment of the low power consumption POR circuit according to the present invention.
Figure 3B:
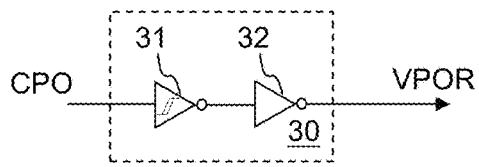
FIG. 3B shows a schematic diagram of a specific embodiment of the signal adjusting circuit of the low power consumption POR circuit according to the present invention.

FIG. 3A shows an embodiment of the low power consumption POR circuit (POR circuit 3A) according to the present invention. The POR circuit 3A further includes a signal adjusting circuit 30 which is configured to operably adjust the comparator output signal CPO to generate the POR signal VPOR. The signal adjusting circuit 30 may include for example but not limited to a level shifter, an inverter, a hysteresis circuit, or a combination thereof. In one embodiment, as shown FIG. 3B, the signal adjusting circuit 30 includes a hysteresis circuit 31 and/or a inverter circuit 32.

Figure 4A:
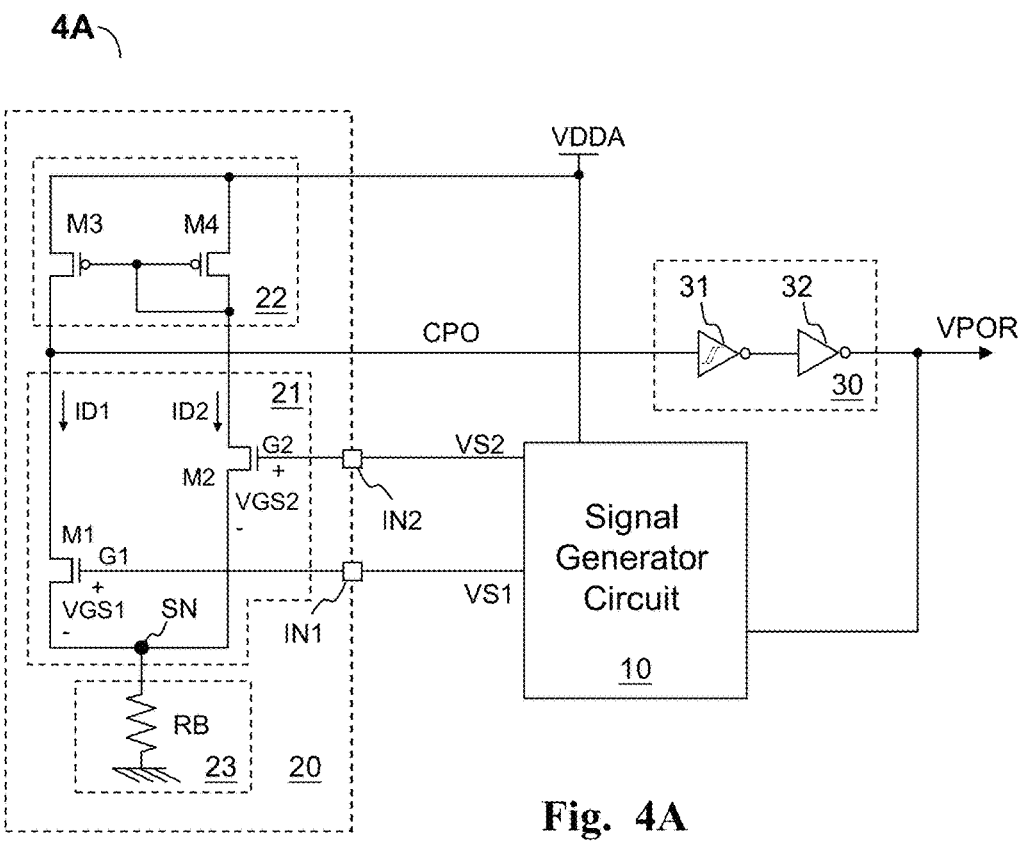
FIGS. 4A and 4B show schematic diagrams of specific embodiments of the comparator circuit of the low power consumption POR circuit according to the present invention.

FIG. 4A shows a schematic diagram of a specific embodiment of the comparator circuit (comparator circuit 20) of the low power consumption POR circuit according to the present invention. In this embodiment, a source of the first MOS transistor M1 and a source of the second MOS transistor M2 are connected to a common source node SN to form a common source differential pair 21. A gate G1 of the first MOS transistor M1 is coupled to the first input terminal IN1 and a gate G2 of the second MOS transistor M2 is coupled to the second input terminal IN2. The comparator circuit 20 generates the comparator output signal CPO according to a difference between a first drain current ID1 of the first MOS transistor M1 and a second drain current ID2 of the second MOS transistor M2. In other embodiments, the first MOS transistor M1 and the second MOS transistor M2 may form other types of circuit structures such as an input stage circuit with a common gate differential pair or other forms (including differential pair or others), which still can achieve the aforementioned functions according to the present invention.

Still referring to FIG. 4A, in one embodiment, the comparator circuit 20 further includes a load stage circuit which operates together with the first MOS transistor M1 and the second MOS transistor M2 to generate the comparator output signal CPO. In this embodiment, the load stage circuit is a current mirror circuit (for example the current mirror circuit 22 including transistors M3 and M4) which is coupled to the first MOS transistor M1 and the second MOS transistor M2 to mirror and compare the first drain current ID1 and the second drain current ID2 to generate the comparator output signal CPO. In one embodiment, the temperature coefficient of the POR threshold VPR1 is substantially zero by determining a mirror ratio M of the current mirror circuit 22. In one embodiment, the mirror ratio M is 1. Note that the current mirror circuit 22 may be embodied with other forms of current mirror circuits, for example a cascoded current mirror. In other embodiments, the load stage circuit is not limited to a current mirror circuit.

Figure 4B:
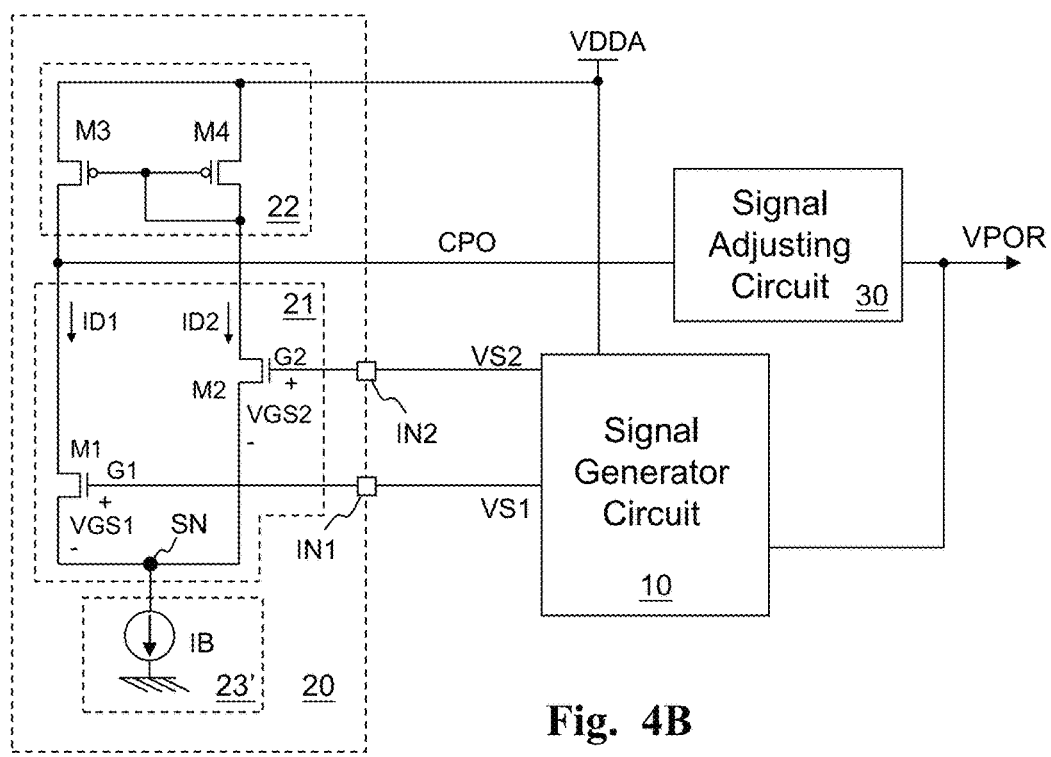

Still referring to FIG. 4A, in one embodiment, the comparator circuit 20 further includes a bias circuit 23 which is coupled to the common source node SN and the bias circuit 23 provides the first bias current IDB1 and the second bias current IDB2. The bias circuit may include a bias current source IB (bias circuit 23' as shown in FIG. 4B) or a bias resistor (bias circuit 23 as shown in FIG. 4A). According to the present invention, each of the first MOS transistor M1 and the second MOS transistor M2 is biased to operate in the subthreshold region; therefore, the current consumption of the POR circuit of the present invention can be as low as several tens of nano amperes (nA). In one embodiment, the power of the comparator circuit may be supplied by the input voltage VDDA as shown in FIG. 4A. In other embodiments, the power of the comparator circuit may be different from the input voltage VDDA.

Figure 5A:
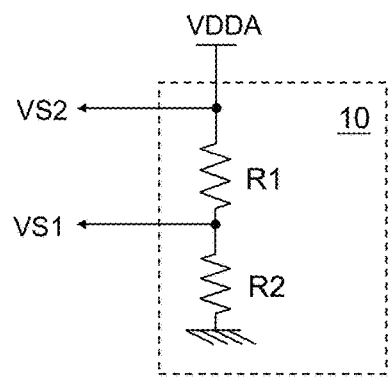
FIGS. 5A and 5B show schematic diagrams of specific embodiments of the signal generator circuit of the low power consumption POR circuit according to the present invention.

FIG. 5A shows a schematic diagram of a specific embodiment of the signal generator circuit of the low power consumption POR circuit according to the present invention (signal generator circuit 10). In one embodiment, the signal generator circuit 10 may be a voltage divider which includes for example but not limited to voltage divider resistors R1 and R2 coupled in series as shown in FIG. 5A. The first signal VS1 and the second signal VS2 are different divided voltages of the input voltage VDDA. In this embodiment, the second signal VS2 is coupled to the input voltage VDDA and the first signal VS1 is a voltage division node where the voltage divider resistors R1 and R2 are commonly connected. In other embodiments, the first signal VS1 and the second signal VS2 may be taken from other nodes of the voltage divider resistor series. Also referring to FIGS. 4A and 5A, in this embodiment, the input voltage VDDA is equal to the difference between the first signal VS1 and the second signal VS2 multiplied by a predetermined number K as shown in the following equations:

$$VDDA=K*(VS2-VS1) \quad\quad \text{Eq. 1, wherein}$$

$$K=(1+R2/R1) \quad\quad \text{Eq. 2}$$

When the input voltage VDDA rises to exceed the first POR threshold VPR1, the comparator output signal CPO transits its state, wherein the first POR threshold VPR1 is equal to the input offset VOS multiplied by the predetermined number K as shown in the following:

$$VPR1=K*VOS \quad\quad \text{Eq. 3}$$

In other words, the POR threshold VPR1 substantially is a product of the input offset VOS multiplied by a predetermined number (i.e. K). That is, in one embodiment, the POR threshold VPR1 can be adjusted according to the ratio of the first signal VS1 to the second signal VS2, wherein $$VOS=VGS2P-VGS1P \quad\quad \text{Eq. 4}$$

wherein VGS1P and VGS2P are the gate-source voltages of the first MOS transistor M1 and the second MOS transistor M2 respectively when the comparator circuit 20 is during state transition.

And since each of the first MOS transistor M1 and the second MOS transistor M2 is biased in the subthreshold region, hence $$VOS = VGS2P - VGS1P = (VTH2 - VTH1) + \varsigma VT\ln\left(\frac{ID2}{ID1}\frac{(W1/L1)}{(W2/L2)}\right) \quad \text{Eq. 5}$$

wherein W1/L1 and W2/L2 indicate the aspect ratios of the first MOS transistor M1 and the second MOS transistor M2 respectively, and Q is a constant. From one perspective, according to Eq. 5, the input offset VOS relates to a difference (VTH2−VTH1) between the threshold voltages of the first MOS transistor M1 and the second MOS transistor M2. In this embodiment, the input offset VOS relates to the first order of the difference of the threshold voltages (VTH2−VTH1).

From Eqs. 3 and 5, in order for temperature coefficient of the POR threshold VPR1 to be zero, the temperature coefficient of the input offset VOS should be 0. And since the difference of the threshold voltages (VTH2−VTH1) usually includes a first order negative temperature coefficient, at least one of the following parameters can be determined to make the temperature coefficient of the first POR threshold to be substantially zero: (1) the first aspect ratio W1/L1, (2) the second aspect ratio W2/L2, (3) the first bias current IDB1, (4) the second bias current IDB2, and/or (5) a product of or a ratio among the above parameters of (1) to (4).

Figure 5B:
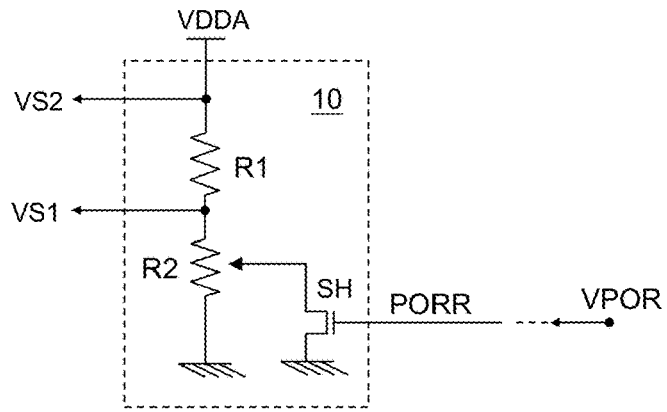

FIG. 5B shows a schematic diagram of a specific embodiment of the signal generator circuit of the low power consumption POR circuit according to the present invention (signal generator circuit 10'). The signal generator circuit 10' is similar to the signal generator circuit 10 shown in FIG. 5A, and further includes a hysteresis control switch SH (for example a MOS transistor), configured to adjust the ratio between the first signal VS1 and the second signal VS2 according to a signal PORR relating to the POR signal ("POR related signal" PORR), such that when the input voltage VDDA falls lower than a second POR threshold VPR2, the POR signal VPOR transits from the second state (e.g. "high") to the first state (e.g. "low"), wherein the second POR threshold VPR2 is lower than the first POR threshold VPR1 such that the POR signal VPOR includes a hysteresis correlated to the input voltage VDDA. In this embodiment, the hysteresis is obtained by controlling the hysteresis control switch SH to adjust the resistance of the voltage divider resistor R2 (for example shorting a portion of R2 by the hysteresis control switch SH) so that the voltage division ratio when the input voltage VDDA is rising is different from that when falling. In one embodiment, the POR related signal PORR may be taken from a signal node in the VPOR signal path. In one embodiment, the POR related signal PORR is the POR signal VPOR itself. The hysteresis of the POR signal VPOR correlated to the input voltage VDDA is not limited to the above embodiment with a falling hysteresis (that is, the POR threshold is equal to VPR1 when the input voltage VDDA is rising and is equal to VPR1 minus a hysteresis (i.e. (VPR1−VPR2)) when the input voltage VDDA is falling); in other embodiments, the hysteresis of the POR signal VPOR correlated to the input voltage VDDA may alternatively be a rising hysteresis (that is, the POR threshold is equal to VPR1 when the input voltage VDDA is falling and is equal to VPR1 plus a hysteresis when the input voltage VDDA is rising). In yet another embodiment, the hysteresis of the POR signal VPOR correlated to the input voltage VDDA may be two sided, that is, the POR thresholds when VDDA is rising and falling are the POR threshold VPR1 plus and minus a hysteresis, respectively.

Figure 6:
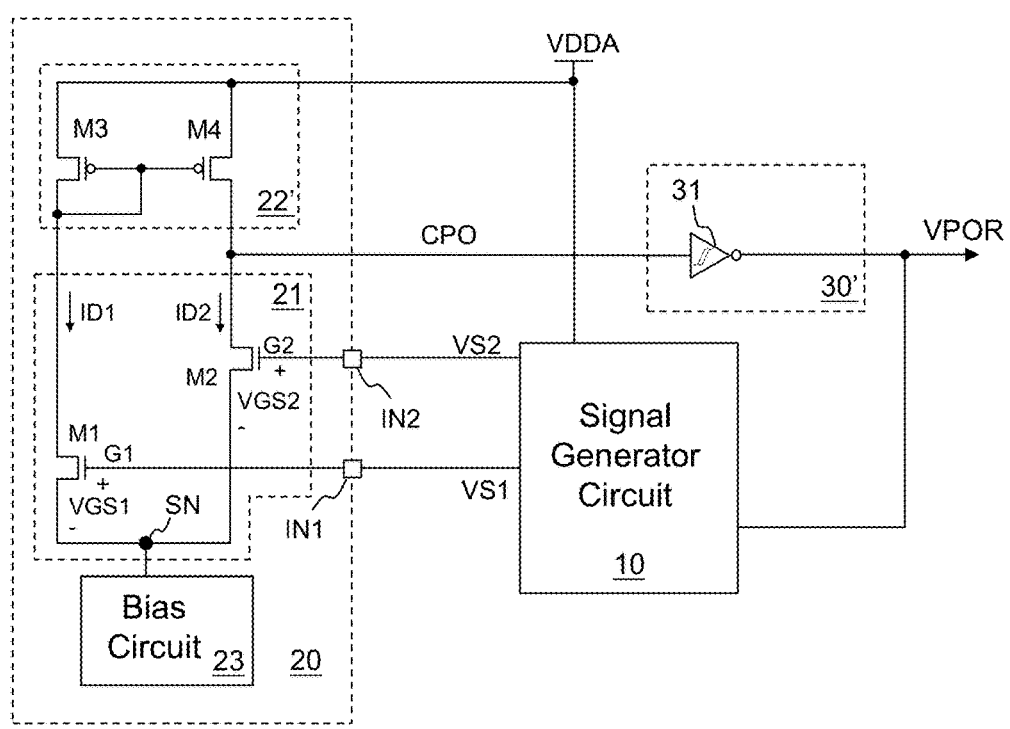
FIG. 6 shows a schematic diagram of a specific embodiment of the low power consumption POR circuit according to the present invention.

FIG. 6 shows a schematic diagram of a specific embodiment of the low power consumption POR circuit according to the present invention (POR circuit 6). The POR circuit 6 is similar to the POR circuit 4A but differs in the node where the comparator output signal CPO is generated from. Therefore, the polarities of the current mirror circuit 22' and the signal adjusting circuit 30' are correspondingly adjusted as shown in the figure.

Figure 7:
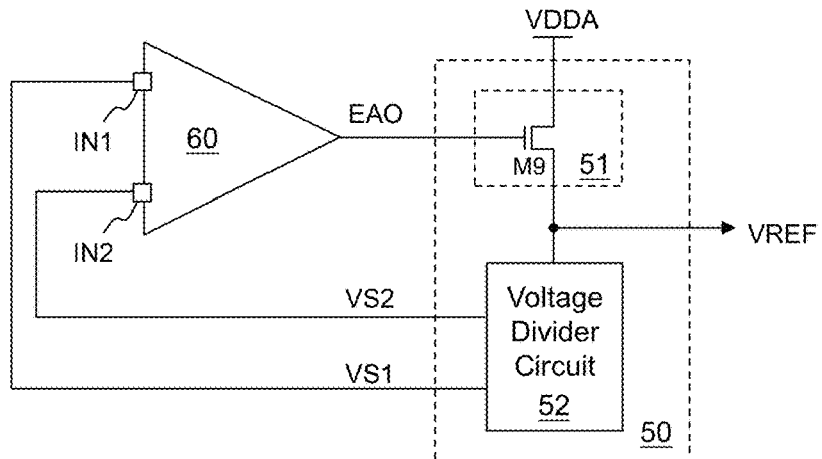
FIG. 7 shows a schematic diagram of an embodiment of the low power consumption reference signal circuit according to the present invention.

FIG. 7 shows a schematic diagram of an embodiment of the low power consumption reference signal circuit according to the present invention (reference signal circuit 7). The reference signal circuit 7, configured to operably generate a reference signal VREF, comprises a signal generator circuit 50 and an amplifier circuit 60. The signal generator circuit 50 includes an active device 51 and a voltage divider circuit 52. The active device 51 converts an input voltage VDDA to the reference signal VREF according to an amplifier output signal EAO. The voltage divider circuit 52 is coupled to the reference signal VREF, wherein the voltage divider circuit 52 generates a first signal VS1 and a second signal VS2 according to the reference signal VREF, wherein the first signal VS1 and the second signal VS2 are different divided voltages of the reference signal VREF. The active device 51 may be for example but not limited to a MOS transistor M9 as shown in the figure or other active devices such as a bipolar transistor. The amplifier circuit 60 includes a first input terminal IN1 and a second input terminal IN2 which are electrically connected to the first signal VS1 and the second signal VS2 respectively, wherein the amplifier circuit 60 amplifies a difference between the first signal VS1 and the second signal VS2 to generate the amplifier output signal EAO.

Figure 8A:
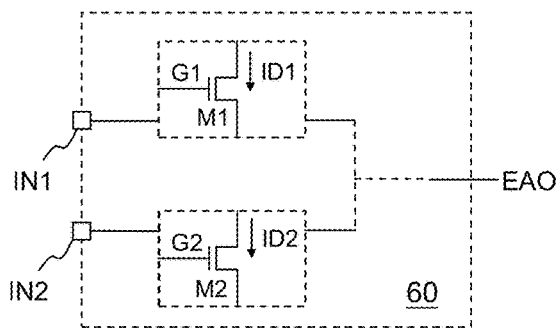
FIGS. 8A and 8B show schematic diagrams of embodiments of the amplifier circuit of the low power consumption reference signal circuit according to the present invention.

FIG. 8A shows a schematic diagram of an embodiment of the amplifier circuit of the low power consumption reference signal circuit according to the present invention (amplifier circuit 60). The amplifier circuit 60 includes a first MOS transistor M1 of a first conductive type and a second MOS transistor M2 of the first conductive type. The first MOS transistor M1 is coupled to the first input terminal IN1 and includes a first conductive type gate G1 and a first threshold voltage VTH1. The second MOS transistor M2 is coupled to the second input terminal IN2 and includes a second conductive type gate G2 and a second threshold voltage VTH2. In this embodiment, each of the first MOS transistor M1 and the second MOS transistor M2 is biased in a subthreshold region. The first signal VS1 and the second signal VS2 as shown in FIG. 7 are configured to control the first MOS transistor M1 and the second MOS transistor M2 respectively to generate the amplifier output signal EAO. A differential input level of the amplifier circuit 60 includes a non-zero input offset VOS, wherein the input offset VOS relates to a difference between the first threshold voltage VTH1 and the second threshold voltage VTH2, for example (VTH2−VTH1). The amplifier circuit 60 controls the active device 51 to regulate the reference signal VREF substantially to a product of the input offset VOS multiplied by a predetermined number, wherein the predetermined number relates to a ratio between the first signal and the second signal.

The "differential input level" means that there is an internal offset between the two input terminals of the amplifier circuit. For example, when the first and the second input terminal IN1 and IN2 of the amplifier circuit 60 receive the first signal VS1 and the second signal VS2 respectively, and the first signal VS1 and the second signal VS2 are at the same level, due to the "differential input level", the amplifier circuit 60 will see that there is a difference between the first signal VS1 and the second signal VS2, and the difference is equal to the "differential input level". According to the present invention, the "differential input level" includes a non-zero "input offset VOS" because transistors with gates of different conductive types are coupled to the first and the second input terminals. For example, given a gain GA of the amplifier circuit 60, the amplifier output signal EAO will be equal to the difference between the first input signal and the second input signal minus the input offset VOS and then multiplied by the gain GA. That is, |EAO|=GA*|(VS1−VS2)−VOS|.

Figure 8B:
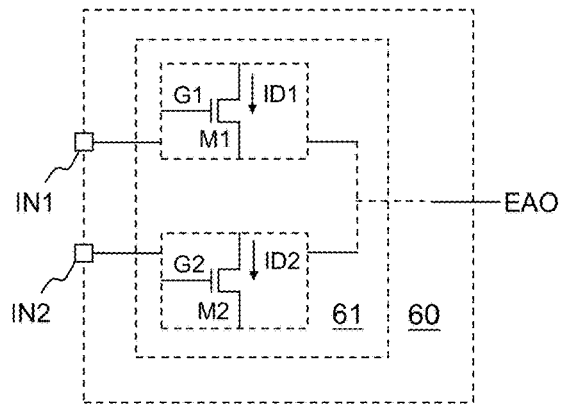

FIG. 8B shows a schematic diagram of an embodiment of the amplifier circuit of the low power consumption reference signal circuit according to the present invention (amplifier circuit 60'). The amplifier circuit 60' is similar to the amplifier circuit 60 shown in FIG. 8A. The first MOS transistor M1 and the second MOS transistor M2 of the amplifier circuit 60' form an input differential pair 61, wherein the input differential pair 61 may be for example but not limited to a common source or a common gate differential pair.

In one embodiment, the first MOS transistor M1 has a first aspect ratio W1/L1 and the second MOS transistor M2 has a second aspect ratio W2/L2, wherein the first MOS transistor M1 is biased with a first bias current IDB1, and the second MOS transistor M2 is biased with a second bias current IDB2, wherein at least one of the following parameters is determined to make a temperature coefficient of the reference signal VREF to be substantially zero: (1) the first aspect ratio W1/L1, (2) the second aspect ratio W2/L2, (3) the first bias current IDB1, (4) the second bias current IDB2, and/or (5) a product of or a ratio among the above parameters of (1) to (4). The "bias current" IDB1 and IDB2 of the first and the second MOS transistors M1 and M2 indicates the drain currents of the first and the second MOS transistors which are operating in the subthreshold region while the amplifier circuit is operating in a steady state.

Figure 9A:
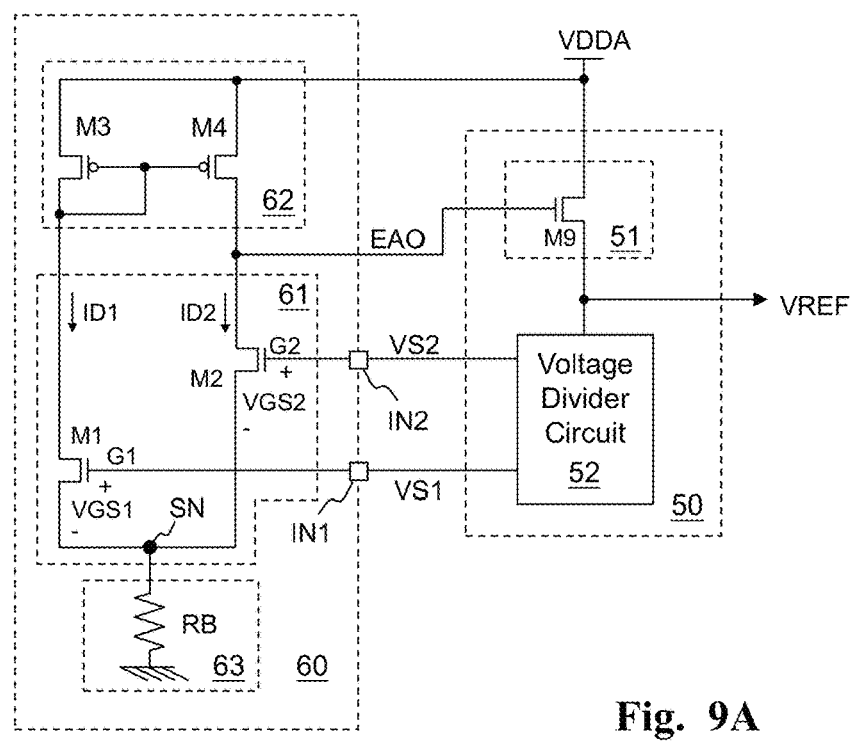
FIGS. 9A and 9B show schematic diagrams of embodiments of the amplifier circuit of the low power consumption reference signal circuit according to the present invention.

FIG. 9A shows a schematic diagram of an embodiment of the amplifier circuit of the low power consumption reference signal circuit according to the present invention (amplifier circuit 60). In this embodiment, a source of the first MOS transistor M1 and a source of the second MOS transistor M2 are connected to a common source node SN to form a common source differential pair 61. A gate G1 of the first MOS transistor M1 is coupled to the first input terminal IN1 and a gate G2 of the second MOS transistor M2 is coupled to the second input terminal IN2. The amplifier circuit 60 generates the amplifier output signal RAO according to a difference between a first drain current ID1 of the first MOS transistor M1 and a second drain current ID2 of the second MOS transistor M2. In other embodiments, the first MOS transistor M1 and the second MOS transistor M2 may form other types of circuit structures such as an input stage circuit with a common gate differential pair or other forms (including differential pair or others), which still can achieve the aforementioned functions according to the present invention.

Figure 9B:
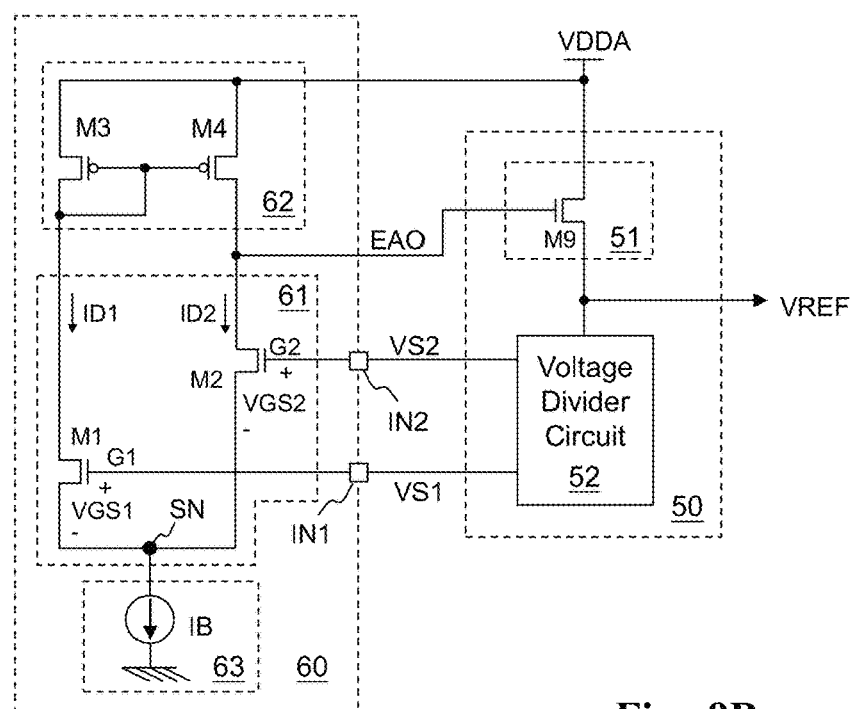
Figure 9C:
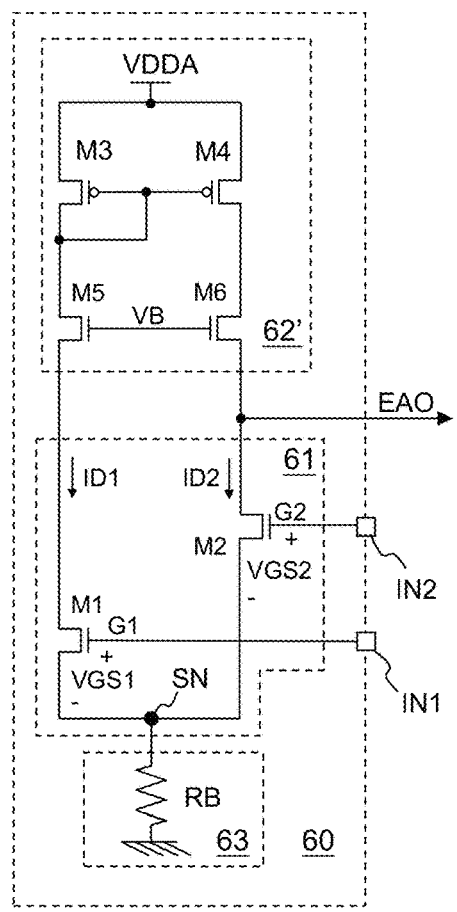
FIG. 9C shows a schematic diagram of a specific embodiment of the current mirror circuit of the low power consumption reference signal circuit according to the present invention.

Still referring to FIG. 9A, in one embodiment, the amplifier circuit 60 further includes a current mirror circuit 62. The current mirror circuit 62, including transistors M3 and M4, is coupled to the first MOS transistor M1 and the second MOS transistor M2 to mirror and amplify the first drain current ID1 and the second drain current ID2 to generate the amplifier output signal EAO. In one embodiment, the temperature coefficient of the reference signal VREF is substantially zero by determining a mirror ratio M of the current mirror circuit 62. In one embodiment, the mirror ratio M is 1. Note that the current mirror circuit 62 may be embodied with other forms of current mirror circuits, for example a cascoded current mirror circuit 62' as shown in FIG. 9C, wherein transistors M5 and M6 are biased with VB to form a cascoded stage to further increase the output impedance of the current mirror circuit 62', and the gain of the amplifier circuit 60.

Still referring to FIG. 9A, in one embodiment, the amplifier circuit 60 further includes a bias circuit 63 which is coupled to the common source node SN and the bias circuit 63 provides the first bias current IDB1 and the second bias current IDB2. The bias circuit 63 may include a bias current source IB (as shown in FIG. 9B) or a bias resistor (as shown in FIG. 9A). According to the present invention, each of the first MOS transistor M1 and the second MOS transistor M2 is biased to operate in the subthreshold region; as such, the current consumption of the reference signal circuit of the present invention can be as low as several tens of nano amperes (nA).

Figure 10:
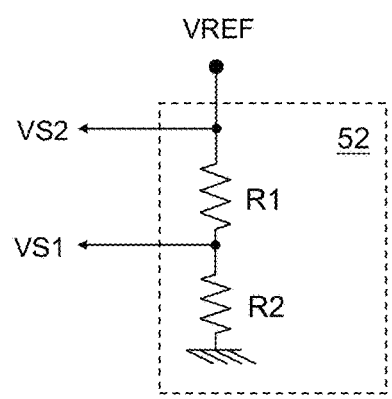
FIG. 10 shows a schematic diagram of a specific embodiment of the voltage divider circuit of the low power consumption reference signal circuit according to the present invention.

FIG. 10 shows a schematic diagram of a specific embodiment of the voltage divider circuit of the low power consumption reference signal circuit according to the present invention (voltage divider circuit 52). In one embodiment, the voltage divider circuit 52 includes for example but not limited to voltage divider resistors R1 and R2 coupled in series as shown in FIG. 10. The first signal VS1 and the second signal VS2 are different divided voltages of the reference signal VREF. In this embodiment, the second signal VS2 is coupled to the reference signal VREF and the first signal VS1 is coupled to a voltage division node where the voltage divider resistors R1 and R2 are commonly connected. In other embodiments, the first signal VS1 and the second signal VS2 may be taken from other nodes of the voltage divider resistor series. Also referring to FIGS. 9A and 10, in this embodiment, the reference signal VREF is equal to the difference between the first signal VS1 and the second signal VS2 multiplied by a predetermined number K as shown in the following equations:

$$VDDA = K*(VS2 - VS1) \qquad \text{Eq. 6, wherein}$$

$$K = (1 + R2/R1) \qquad \text{Eq. 7}$$

When the amplifier circuit (e.g. the amplifier circuit 60 shown in FIG. 9A) regulates the reference signal VREF to the steady state, as described hereinbefore, the amplifier circuit includes an input offset VOS so that the difference between the first signal VS1 and the second signal VS2 is substantially equal to the input offset VOS; therefore, the reference signal VREF is equal to the input offset VOS multiplied by the predetermined number K as shown in the following:

$$VREF = K*VOS \qquad \text{Eq. 8}$$

In other words, the reference signal VREF substantially is a product of the input offset VOS multiplied by the predetermined number. That is, in one embodiment, the reference signal VREF can be adjusted according to the ratio of the first signal VS1 to the second signal VS2, wherein $$VOS = VGS2P - VGS1P \qquad \text{Eq. 9}$$

wherein VGS1P and VGS2P are the gate-source voltages of the first MOS transistor M1 and the second MOS transistor M2 respectively when the amplifier circuit 60 is in the steady state. And since each of the first MOS transistor M1 and the second MOS transistor M2 is biased in the subthreshold region, hence $$VOS = \qquad \text{Eq. 10}$$

$$VGS2P - VGS1P = (VTH2 - VTH1) + \varsigma VT\ln\left(\frac{ID2}{ID1}\frac{(W1/L1)}{(W2/L2)}\right)$$

wherein W1/L1 and W2/L2 indicate the aspect ratios of the first MOS transistor M1 and the second MOS transistor M2, and Q is a constant. From one perspective, according to Eq. 10, the input offset VOS relates to a difference (VTH2−VTH1) between the threshold voltages of the first MOS transistor M1 and the second MOS transistor M2. In this embodiment, the input offset VOS relates to the first order of the difference of the threshold voltages (VTH2−VTH1).

From Eqs. 8 and 10, in order for the temperature coefficient of the reference signal VREF to be zero, the temperature coefficient of the input offset VOS should be 0. And since the difference of the threshold voltages (VTH2−VTH1) usually includes a first order negative temperature coefficient, at least one of the following parameters can be determined to make the temperature coefficient of the first POR threshold to be substantially zero: (1) the first aspect ratio W1/L1, (2) the second aspect ratio W2/L2, (3) the first bias current IDB1, (4) the second bias current IDB2, and/or (5) a product of or a ratio among the above parameters of (1) to (4).

According to the present invention, in one preferred embodiment, the first and the second MOS transistors are of the same operation type (such as enhancement mode, depletion mode or native MOS transistors) of the same conductive type (for example but not limited to N-type), but include different conductive types of gates respectively (e.g., the first MOS transistor is an NMOS transistor including an N type gate and the second MOS is an NMOS transistor including a P type gate). Hence, the threshold voltage difference between the first MOS transistor and the second MOS transistor is highly consistent throughout different products despite manufacture variations, and therefore the POR threshold of the POR circuit and the reference signal of the reference signal circuit also keep high consistency. Because there is high consistency, the manufacture control is less complicated and the manufacturing cost can be reduced. In one embodiment, within the temperature range of −40° C.-125° C. and with manufacture variations (for example within a manufacture distribution of 3 standard deviation without trimming), the distribution of the POR threshold and the reference signal can be less than 200 mV. In one embodiment, within the temperature range of −40° C.-125° C. and with manufacture variations, the distribution of the POR threshold and the reference signal can be less than 100 mV. In one embodiment, within the temperature range of −40° C.-125° C. and with manufacture variations, the distribution of the POR threshold and the reference signal can be less than 50 mV.

Figure 11:
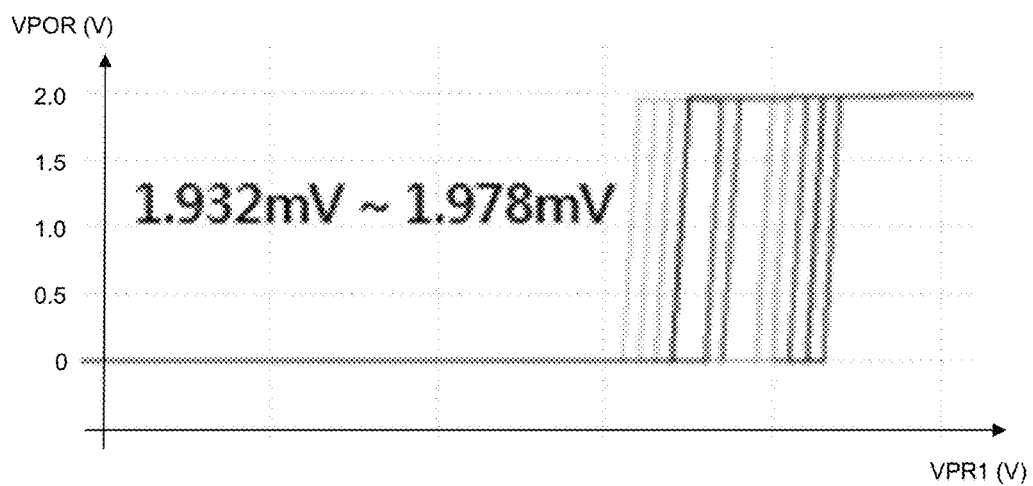
FIG. 11 shows simulation waveforms corresponding to the low power consumption POR circuit according to the present invention.

FIG. 11 shows simulation waveforms corresponding to the low power consumption POR circuit (e.g. the embodiment shown in FIG. 4A) according to the present invention. As shown in the figure, according to the present invention, the threshold voltage difference between the first the second MOS transistors keeps high consistency; hence in this embodiment, within the temperature range of −40° C.-125° C. and with manufacture variations, the distribution of the POR threshold VPR1 can be within 50 mV, which illustrates that the present invention has advantages of low power consumption, high precision (including low temperature coefficient) and low manufacturing cost.

The present invention has been described in considerable detail with reference to certain preferred embodiments thereof. It should be understood that the description is for illustrative purpose, not for limiting the scope of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. As an example, the "cascoded current mirror circuit" may be embodied in the comparator circuit. Besides, various types of current mirror circuits or bias circuits may be combined with the "common source differential pair" or the "common gate differential pair". Furthermore, those skilled in this art can readily conceive variations and modifications within the spirit of the present invention. As an example, the first and the second MOS transistors are not limited to the enhancement mode, depletion mode or native MOS transistors as described hereinbefore. It should be considered fallen within the scope of the present invention as long as the first and the second MOS transistors are of the same conductive type with different dopant conductive types of gates. As another example, the first and the second MOS transistors are embodied with NMOS transistors throughout the aforementioned embodiments for illustrating the spirit of the present invention. However, PMOS transistors are certainly also suitable for the same purpose according to the present invention. In this case, the polarities of the corresponding circuits should be rearranged accordingly. As another example, the first and the second input terminals are not limited to being coupled to the first and the second MOS transistors directly, and may be coupled to a pre-stage circuit such as a level shifter circuit. As another example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. The spirit of the present invention should cover all such and other modifications and variations, which should be interpreted to fall within the scope of the following claims and their equivalents.

What is claimed is:

1. A power-on reset (POR) circuit, configured to operably generate a power-on reset signal, comprising:
    a signal generator circuit, configured to operably generate a first signal and a second signal; and
    a comparator circuit, including a first input terminal and a second input terminal which are electrically connected to the first signal and the second signal respectively, wherein the comparator circuit compares the first signal and the second signal to generate a comparator output signal, wherein the POR circuit generates the POR signal according to the comparator output signal, the comparator circuit including:
        a first MOS transistor of a first conductive type, coupled to the first input terminal, wherein the first MOS transistor includes a first conductive type gate and a first threshold voltage; and
        a second MOS transistor of the first conductive type, coupled to the second input terminal, wherein the second MOS transistor includes a second conductive type gate and a second threshold voltage;
    wherein each of the first MOS transistor and the second MOS transistor is biased in a subthreshold region;
    wherein the first signal and the second signal control the first MOS transistor and the second MOS transistor respectively to generate the comparator output signal;
    wherein a differential input level of the comparator circuit includes a non-zero input offset, wherein the input offset relates to a difference between the first threshold voltage and the second threshold voltage;
    wherein when the input voltage rises to exceed a first POR threshold, the comparator output signal transits from a first state to a second state;
    wherein the first POR threshold substantially is a product of the input offset multiplied by a predetermined number;
    wherein both the first MOS transistor and the second MOS transistor are of the same one of the following types of MOS transistors: (1) enhancement mode MOS transistor, (2) depletion mode MOS transistor, or (3) native transistor.

2. The POR circuit of claim 1, wherein the first MOS transistor has a first aspect ratio and the second MOS transistor has a second aspect ratio, wherein the first MOS transistor is biased with a first bias current, and the second MOS transistor is biased with a second bias current, wherein at least one of the following parameters is determined such that a temperature coefficient of the first POR threshold is substantially zero: (1) the first aspect ratio, (2) the second aspect ratio, (3) the first bias current, (4) the second bias current, and/or (5) a product of or a ratio among the above parameters of (1) to (4).

3. The POR circuit of claim 1, further including a signal adjusting circuit configured to operably adjust the comparator output signal to generate the POR signal.

4. The POR circuit of claim 1, wherein the first MOS transistor and the second MOS transistor form an input differential pair.

5. The POR circuit of claim 4, wherein the input differential pair is a common source differential pair, a source of the first MOS transistor and a source of the second MOS transistor being connected to a common source node to form the common source differential pair, a gate of the first MOS transistor being coupled to the first input terminal and a gate of the second MOS transistor being coupled to the second input terminal, and wherein the comparator circuit generates the comparator output signal according to a difference between a first drain current of the first MOS transistor and a second drain current of the second MOS transistor.

6. The POR circuit of claim 5, wherein the comparator circuit further includes a current mirror circuit, coupled with the first MOS transistor and the second MOS transistor, and is configured to operably mirror and compare the first drain current and the second drain current to generate the comparator output signal.

7. The POR circuit of claim 6, wherein the temperature coefficient is substantially zero by determining a mirror ratio of the current mirror circuit.

8. The POR circuit of claim 5, wherein the comparator circuit further includes a bias circuit which includes a bias current source or a bias resistor coupled to the common source node, the bias circuit being configured to provide the first bias current and the second bias current.

9. The POR circuit of claim 1, wherein the first signal and the second signal are different divided voltages of the input voltage.

10. The POR circuit of claim 9, wherein the signal generator circuit includes a hysteresis control switch, configured to adjust a ratio between the first signal and the second signal according to a signal relating to the POR signal (a POR related signal), such that when the input voltage falls lower than a second POR threshold, the POR signal transits from the second state to the first state, wherein the second POR threshold is lower than the first POR threshold such that the POR signal has a hysteresis correlated to the input voltage.

11. The POR circuit of claim 1, wherein the first POR threshold is determined by the POR circuit according to a ratio between the first signal and the second signal.

12. A reference signal circuit, configured to operably generate a reference signal, comprising:
a signal generator circuit, including:
an active device, configured to operably convert an input voltage to the reference signal according to an amplifier output signal; and
a voltage divider circuit, coupled to the reference signal, wherein the voltage divider circuit generates a first signal and a second signal according to the reference signal, wherein the first signal and the second signal are different divided voltages of the reference signal; and
an amplifier circuit, including a first input terminal and a second input terminal which are electrically connected to the first signal and the second signal respectively, wherein the amplifier circuit amplifies a difference between the first signal and the second signal to generate the amplifier output signal, the amplifier circuit including:
a first MOS transistor of a first conductive type, coupled to the first input terminal, wherein the first MOS transistor includes a first conductive type gate and a first threshold voltage; and
a second MOS transistor of the first conductive type, coupled to the second input terminal, wherein the second MOS transistor includes a second conductive type gate and a second threshold voltage;
wherein the first signal and the second signal control the first MOS transistor and the second MOS transistor respectively to generate the amplifier output signal;
wherein each of the first MOS transistor and the second MOS transistor is biased in a subthreshold region;
wherein a differential input level of the amplifier circuit includes a non-zero input offset, wherein the input offset relates to a difference between the first threshold voltage and the second threshold voltage;
wherein the amplifier circuit controls the active device to regulate the reference signal substantially to a product of the input offset multiplied by a predetermined number, wherein the predetermined number relates to a ratio between the first signal and the second signal;
wherein both the first MOS transistor and the second MOS transistor are of the same one of the following types of MOS transistors: (1) enhancement mode MOS transistor, (2) depletion mode MOS transistor, or (3) native transistor.

13. The reference signal circuit of claim 12, wherein the first MOS transistor has a first aspect ratio and the second MOS transistor has a second aspect ratio, wherein the first MOS transistor is biased with a first bias current, and the second MOS transistor is biased with a second bias current, wherein at least one of the following parameters is determined such that a temperature coefficient of the reference signal is substantially zero: (1) the first aspect ratio, (2) the second aspect ratio, (3) the first bias current, (4) the second bias current, and/or (5) a product of or a ratio among the above parameters of (1) to (4).

14. The reference signal circuit of claim 12, wherein the first MOS transistor and the second MOS transistor form an input differential pair.

15. The reference signal circuit of claim 14, wherein a source of the first MOS transistor and a source of the second MOS transistor are connected to a common source node to form a common source differential pair, and a gate of the first MOS transistor is coupled to the first input terminal and a gate of the second MOS transistor is coupled to the second input terminal, and wherein the amplifier circuit generates the amplifier output signal according to a difference between a first drain current of the first MOS transistor and a second drain current of the second MOS transistor.

16. The reference signal circuit of claim 15, wherein the amplifier circuit further includes a current mirror circuit, coupled with the first MOS transistor and the second MOS transistor, and is configured to operably mirror the first drain current and the second drain current to generate the amplifier output signal.

17. The reference signal circuit of claim 16, wherein the temperature coefficient is substantially zero by determining a mirror ratio of the current mirror circuit.

18. The reference signal circuit of claim 15, wherein the amplifier circuit further includes a bias circuit which includes a bias current source or a bias resistor coupled to the common source node, the bias circuit being configured to provide the first bias current and the second bias current.

19. The reference signal circuit of claim 12, wherein the reference signal is determined by the reference signal circuit according to a ratio between the first signal and the second signal.

\* \* \* \* \*